(12) United States Patent
Choi et al.

(10) Patent No.: US 9,190,464 B2
(45) Date of Patent: Nov. 17, 2015

(54) NONVOLATILE MEMORY DEVICES WITH ALIGNED TRENCH ISOLATION REGIONS

(71) Applicant: Samsung Electronics Co., Ltd., Suwon-si (KR)

(72) Inventors: Joon-Young Choi, Suwon-Si (KR); Sang-Eun Lee, Hwaseong-si (KR); Sam-Jong Choi, Suwon-si (KR); Jin-Ho Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 9 days.

(21) Appl. No.: 14/136,273

(22) Filed: Dec. 20, 2013

(65) Prior Publication Data

US 2014/0197465 A1 Jul. 17, 2014

(30) Foreign Application Priority Data

Jan. 14, 2013 (KR) .......................... 10-2013-0004042

(51) Int. Cl.
| | |
|---|---|
| *H01L 29/04* | (2006.01) |
| *H01L 29/788* | (2006.01) |
| *H01L 29/792* | (2006.01) |
| *H01L 27/115* | (2006.01) |

(52) U.S. Cl.
CPC .......... *H01L 29/045* (2013.01); *H01L 29/7881* (2013.01); *H01L 29/792* (2013.01); *H01L 27/1157* (2013.01)

(58) Field of Classification Search
CPC ... H01L 29/045; H01L 29/788; H01L 29/792; H01L 27/1157
See application file for complete search history.

(56) References Cited

U.S. PATENT DOCUMENTS

| | | | |
|---|---|---|---|
| 5,576,223 | A | 11/1996 | Zeininger et al. |
| 6,483,171 | B1 | 11/2002 | Forbes et al. |
| 6,563,159 | B1 | 5/2003 | Kunikiyo et al. |
| 7,132,324 | B2 | 11/2006 | Cheng et al. |
| 7,271,467 | B2 | 9/2007 | Noble et al. |
| 7,282,400 | B2 | 10/2007 | Noble et al. |
| 7,368,350 | B2 | 5/2008 | Olligs et al. |
| 7,439,559 | B2 | 10/2008 | Cheng et al. |
| 2002/0076900 | A1* | 6/2002 | Park et al. ..................... 438/424 |
| 2002/0104988 | A1* | 8/2002 | Shibata et al. .................. 257/11 |
| 2005/0045926 | A1* | 3/2005 | Mouli ........................... 257/294 |
| 2007/0228425 | A1* | 10/2007 | Miller et al. .................. 257/288 |
| 2008/0283898 | A1* | 11/2008 | Kuniya ......................... 257/316 |

(Continued)

FOREIGN PATENT DOCUMENTS

| | | |
|---|---|---|
| JP | 2001-196333 | 7/2001 |
| JP | 2001-332462 | 11/2001 |

(Continued)

*Primary Examiner* — Kevin Parendo
(74) *Attorney, Agent, or Firm* — Myers Bigel Sibley & Sajovec, P.A.

(57) ABSTRACT

A nonvolatile memory device includes a substrate, an elongate isolation region including a field insulation film disposed in a trench in the substrate, and a word line crossing the insulation region and including a tunneling insulation layer on an active region of the substrate adjacent the isolation region, a charge storage layer on the tunneling insulation layer and a blocking insulation layer on the charge storage layer. A first plane index of a bottom surface of the trench has a first interface trap density and a second plane index of a sidewall of the trench has a second interface trap density equal to or less than the first interface trap density. In some embodiments, the first plane index may be (100) and the second plane index may be (100) or (310).

12 Claims, 9 Drawing Sheets

(56) References Cited

U.S. PATENT DOCUMENTS

2010/0317169 A1* 12/2010 Sung et al. .................... 438/287
2012/0168868 A1* 7/2012 Chiu et al. .................... 257/365

FOREIGN PATENT DOCUMENTS

| JP | 2002-164311 | 6/2002 |
| JP | 2004-119943 | 4/2004 |
| JP | 2004-265918 | 9/2004 |
| KR | 1020000073375 | 12/2000 |
| KR | 1020040035787 | 4/2004 |
| KR | 100448084 | 12/2004 |
| KR | 1020090109667 | 10/2009 |

* cited by examiner

NONVOLATILE MEMORY DEVICES WITH ALIGNED TRENCH ISOLATION REGIONS

CROSS-REFERENCE TO RELATED APPLICATION

This application claims priority from Korean Patent Application No. 10-2013-0004042 filed on Jan. 14, 2013 in the Korean Intellectual Property Office, and all the benefits accruing therefrom under 35 U.S.C. 119, the contents of which in its entirety are herein incorporated by reference.

BACKGROUND

The inventive subject matter relates to semiconductor devices and, more particularly, to non-volatile memory devices.

It is generally desirable for a NAND flash memory device for a mobile product to have low power consumption. To this end, it may be desirable for a cell transistor used in the NAND flash memory device to have a low operating voltage. However, increasing the integration level of the cell transistor may cause a short channel effect.

Conventional techniques for obtaining a sufficient amount of cell current adjusting a cell Vth implant in a gate region and an LDD implant in a source/drain region. In a 20 nm cell array structure, however, accurate implant adjustment may be difficult to achieve, which may make it difficult to obtain a cell current level sufficient to meet product performance requirements. In addition, there may be an increasing difference in the cell current level between cell transistors.

SUMMARY

According to some embodiments of the inventive subject matter, a nonvolatile memory device includes a substrate, an elongate isolation region including a field insulation film disposed in a trench in the substrate, and a word line crossing the insulation region and including a tunneling insulation layer on an active region of the substrate adjacent the isolation region, a charge storage layer on the tunneling insulation layer and a blocking insulation layer on the charge storage layer. A first plane index of a bottom surface of the trench has a first interface trap density and a second plane index of a sidewall of the trench has a second interface trap density equal to or less than the first interface trap density. In some embodiments, the first plane index may be (100) and the second plane index may be (100) or (310).

In some embodiments, the substrate may have an alignment basis region having a plane index corresponding to a rotation of $\alpha°$ from a plane having a plane index (110), where $0<\alpha\leq45$ or $-45\leq\alpha<0$. In some embodiments, $\alpha$ is 18.5 or −18.5. A plane index of the alignment basis region may be (100).

In further embodiments, the word line may extend in a <100> direction.

In some embodiments, a separate junction area may not be formed in the active region.

In some embodiments, the substrate may be a silicon on insulator (SOI) substrate. The substrate may include a base substrate and an epitaxial layer disposed on the base substrate.

Some embodiments of the inventive subject matter provide a nonvolatile memory device including a substrate having an alignment basis region having a plane index corresponding to a rotation of $\alpha°$ from a plane having a plane index (110), where $0<\alpha\leq45$ or $-45\leq\alpha<0$. The memory device further includes an elongate isolation region including a field insulation film disposed in a trench in the substrate and a word line crossing the insulation region and including a tunneling insulation layer on an active region of the substrate adjacent the isolation region, a charge storage layer on the tunneling insulation layer and a blocking insulation layer on the charge storage layer.

In some embodiments, $\alpha$ may be 18.5 or −18.5. A first plane index of a bottom surface of the trench may be (100) and a second plane index of a sidewall of trench may be (100) or (310). In some embodiments, a separate junction area may not be formed in the active region.

Still further embodiments of the inventive subject matter provide a nonvolatile memory device including a substrate having an alignment basis region with a plane index of (100), an elongate isolation region in the substrate and defining an elongate active region and a word line crossing the active region and including a tunneling insulation layer on the active region, a charge storage layer on the tunneling insulation layer and a blocking insulation layer on the charge storage layer. The active region and the word line linearly extend along respective different <100> directions. The isolation region may include a field insulation film in a trench, wherein a first plane index of a bottom surface of the trench has a first interface trap density and wherein a second plane index of a sidewall of the trench has a second interface trap density equal to or less than the first interface trap density. The first plane index may be (100) and the second plane index may be (100) or (310).

BRIEF DESCRIPTION OF THE DRAWINGS

The above and other features and advantages of the inventive subject matter will become more apparent by describing in detail preferred embodiments thereof with reference to the attached drawings in which.

DETAILED DESCRIPTION OF THE EMBODIMENTS

The inventive subject matter will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the inventive subject matter.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

In the specification of the inventive subject matter, a plane index is indicated using round brackets (or parentheses, half-moon brackets, etc.), for example, (100). A direction is indicated using square brackets, for example, <100>.

Figure 1:
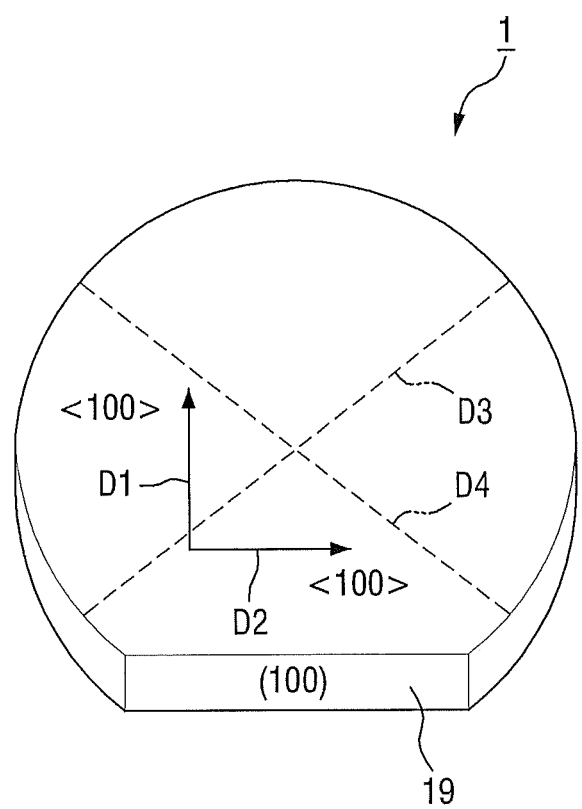
FIG. 1 illustrates an exemplary substrate used in a nonvolatile memory device according to some embodiments of the inventive subject matter.

FIG. 1 illustrates an exemplary substrate used in a nonvolatile memory device according to some embodiments of the inventive subject matter.

Referring to FIG. 1, a substrate 1 used in a nonvolatile memory device according to some embodiments of the inventive subject matter may have a plane index (100) of an alignment basis region 19. In FIG. 1, the alignment basis region 19 is exemplified as a flat zone, but aspects of the inventive subject matter are not limited thereto. For example, the alignment basis region 19 may be a notch.

Accordingly, a first direction D1 parallel to a normal of the alignment basis region 19, and a second direction D2 perpendicular to a normal of the alignment basis region 19, may both be <100>. In addition, a third direction D3 and a fourth direction D4, which are positioned at 45° with respect to the first direction D1 and the second direction D2, may both be <110>.

In other words, the substrate 1 may have the alignment basis region 19 having a plane index formed by rotating 45° (or −45°) from a plane having a plane index (110), where $0<\alpha\le45$ or $-45\le\alpha<0$). If the (110) plane is rotated 45°, the alignment basis region 19 may have a plane index (100).

The substrate 1 may be made of one or more semiconductor materials selected from the group consisting of Si, Ge, SiGe, GaP, GaAs, SiC, SiGeC, InAs, and InP, but is not limited thereto.

Figure 2:
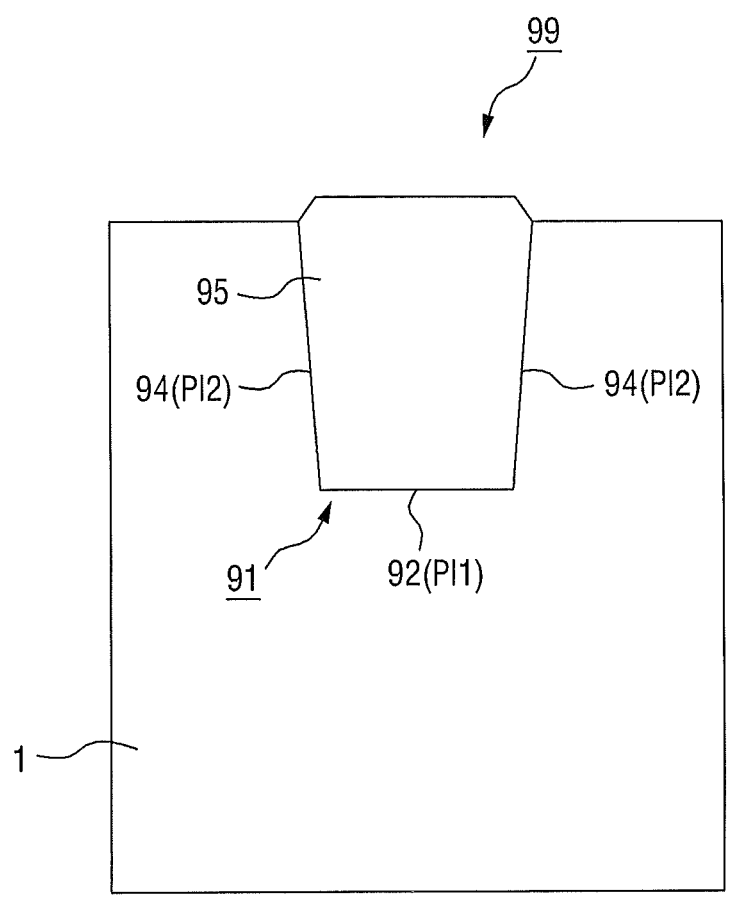
FIG. 2 is a cross-sectional view illustrating an isolation region used in a nonvolatile memory device according to some embodiments of the inventive subject matter.
Figure 11:
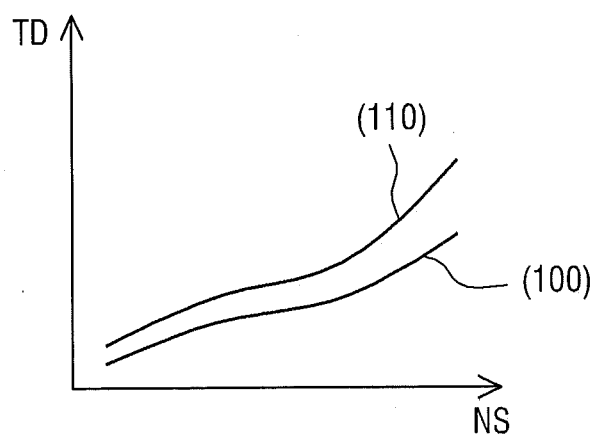
FIG. 11 illustrates a relationship between a plane index and an interface trap density.

FIG. 2 is a cross-sectional view illustrating an isolation region used in a nonvolatile memory device according to some embodiments of the inventive subject matter. FIG. 11 illustrates a relationship between a plane index and an interface trap density.

Referring first to FIG. 2, an isolation region 99 is formed on the substrate 1 shown in FIG. 1. In addition, the isolation region 99 includes a trench 91 and a field insulation film 95 filling the trench 91. In FIG. 2, the trench 91 is exemplified to be in a downwardly tapered shape, but embodiments of the inventive subject matter are not limited thereto. In addition, the field insulation film 95 may be, for example, an oxide film, a nitride film, an oxynitride film, combinations thereof, and a stack of these films.

The trench 91 may have a bottom surface 92 having a first plane index PI1 and a sidewall 94 having a second plane index PI2, and the first plane index PI1 and the second plane index PI2 are different.

The first plane index PI1 may have a first interface trap density, and the second plane index PI2 may have a second interface trap density equal to or less than the first interface trap density. For example, the first plane index PI1 may be (100), and the second plane index PI2 may be (100) or (310).

Referring to FIG. 11, the x-axis indicates negative stress (NS), and the y-axis indicates interface trap density (TD). Referring to FIG. 11, even if the negative stress increases, the interface trap density of the plane index (100) is less than that of the plane index (110).

Referring again to FIG. 2, if there are many interface traps in the sidewall 94 of the trench 91, minority carriers (e.g., intrinsic electrons) and the interface traps meet, so that recombination may easily occur and a large amount of current loss may be generated. Therefore, in a nonvolatile memory device according to some embodiments of the inventive subject matter, the second interface trap density (interface traps of the second plane index PI2) may be equal to or less than the first interface trap density (interface traps of the first plane index PI1).

Conversely, if the alignment basis region of the substrate has a plane index (110), and an isolation region corresponding to the alignment basis region is formed, the trench bottom has a plane index (100) and the trench sidewall has a plane index (110). The plane index (110) has more interface traps than the plane index (100). In this case, since the minority carriers (e.g., intrinsic electrons) meet the interface traps of the trench sidewall, recombination is liable to occur, increasing a loss in current.

Figure 3:
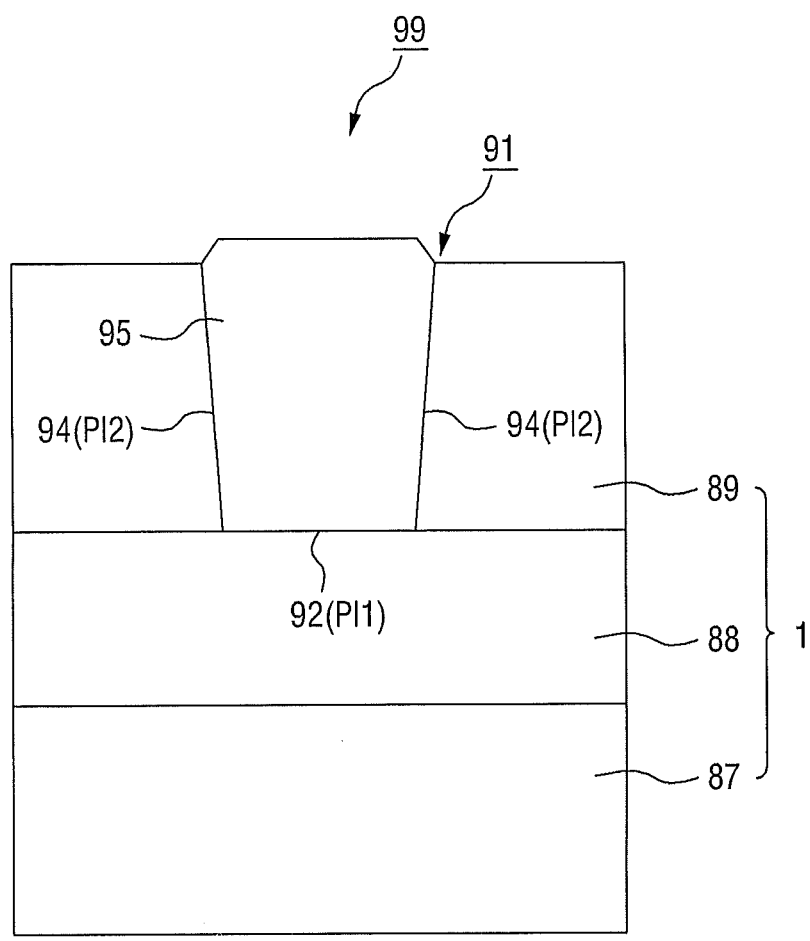
FIG. 3 is a cross-sectional view illustrating an isolation region used in a nonvolatile memory device according to further embodiments of the inventive subject matter.

FIG. 3 is a cross-sectional view illustrating an isolation region used in a nonvolatile memory device according to further embodiments of the inventive subject matter. For the sake of convenient explanation, the following description will focus on differences between the isolation regions used in the nonvolatile memory devices shown in FIGS. 2 and 3.

Referring to FIG. 3, the substrate 1 may be a silicon-on-insulator (SOI) substrate. For example, the substrate 1 may include a base substrate 87, an insulation layer 88 formed on the base substrate 87, and a conductive layer 89 formed on the insulation layer 88. The insulation layer 88 may include, for example, an oxide film ($SiO_2$), but embodiments of the inventive subject matter are not limited thereto. The SOI substrate may reduce leakage current and may reduce power consumption of an integrated circuit chip. In addition, the SOI substrate may have a relatively low impurity concentration, compared to a silicon single crystalline substrate. Therefore, the leakage current may further be reduced by forming the isolation region 99 in the conductive layer 89.

Figure 4:
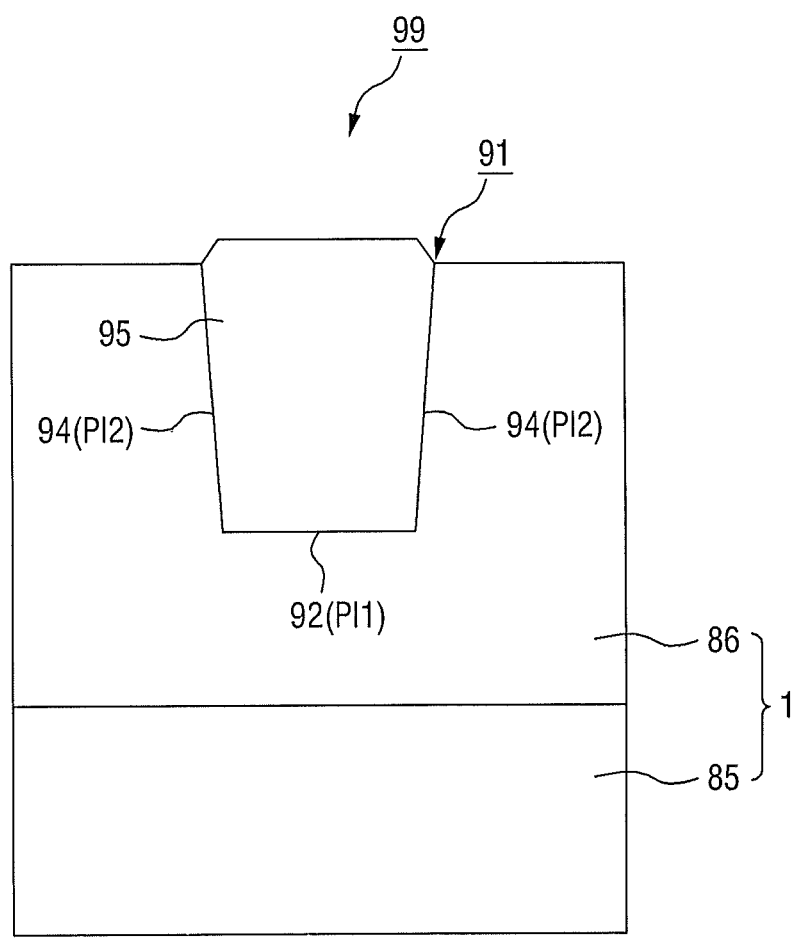
FIG. 4 is a cross-sectional view illustrating an isolation region used in a nonvolatile memory device according to further embodiments of the inventive subject matter.

FIG. 4 is a cross-sectional view illustrating an isolation region used in a nonvolatile memory device according to further embodiments of the inventive subject matter. For the sake of convenient explanation, the following description will focus on differences between the isolation regions used in the nonvolatile memory devices shown in FIGS. 2 and 4.

Referring to FIG. 4, the substrate 1 may include a base substrate 85 and an epitaxial (epi) layer 86 formed on the base substrate 85. The epi layer 86 may be grown in the same crystal direction as that of the base substrate 85.

Figure 5:
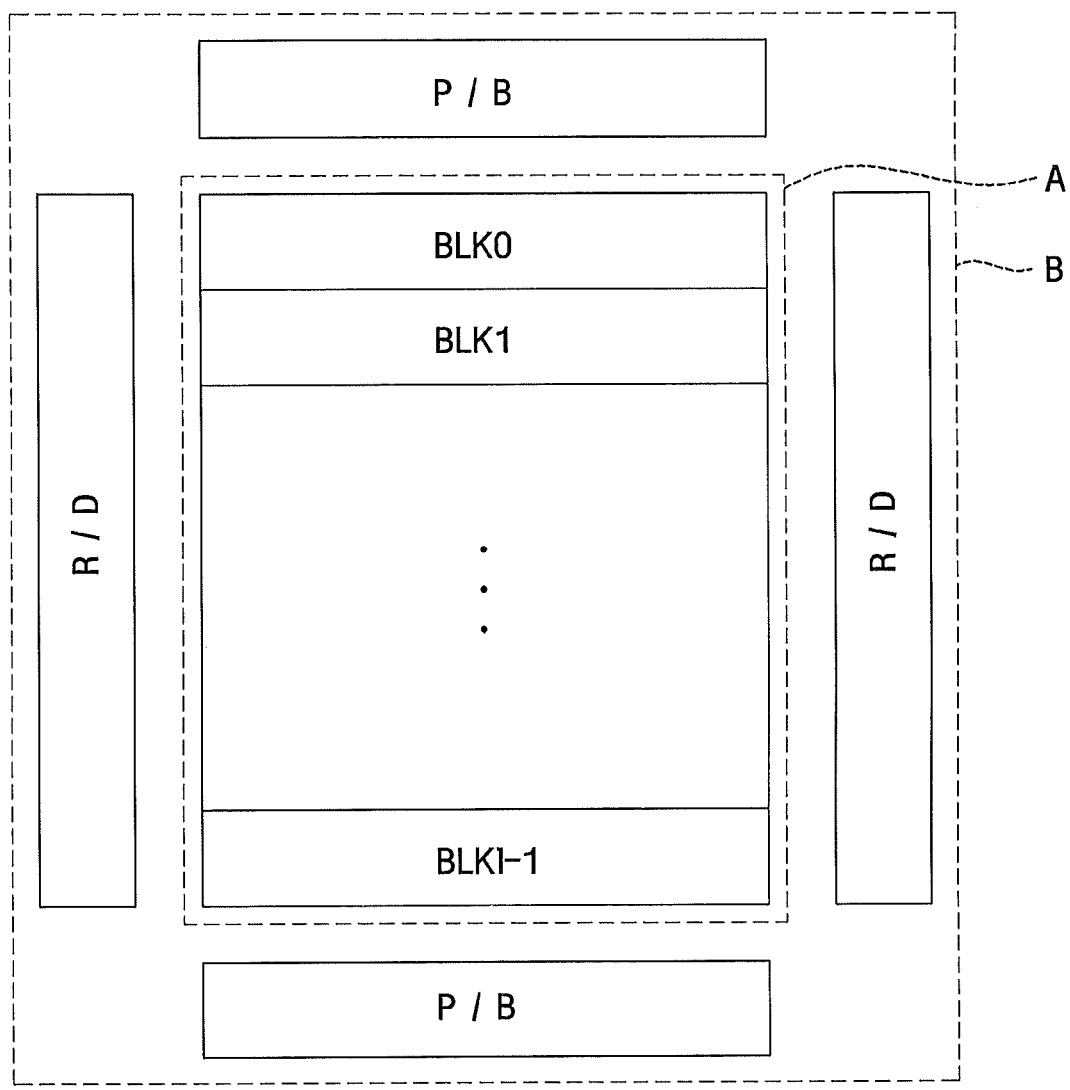
FIG. 5 is a block diagram of a nonvolatile memory device according to further embodiments of the inventive subject matter.
Figure 8:
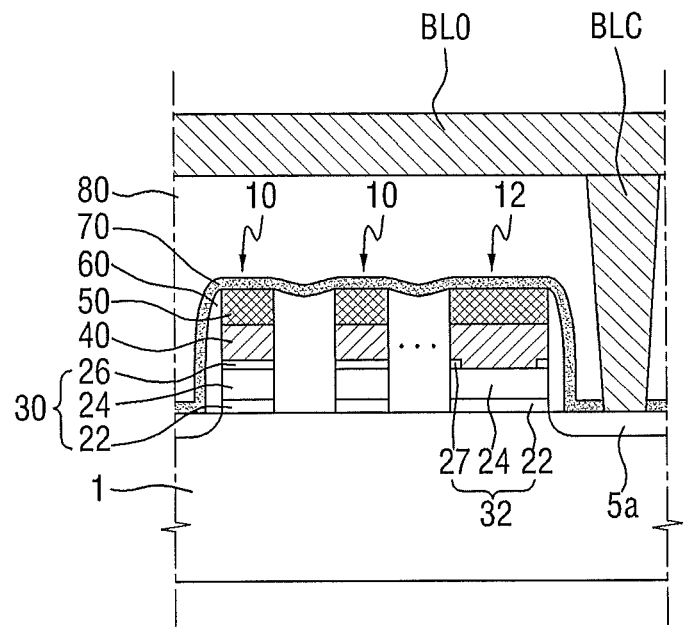
FIG. 8 is a cross-sectional view taken along the line Y-Y of FIG. 7.
Figure 9:
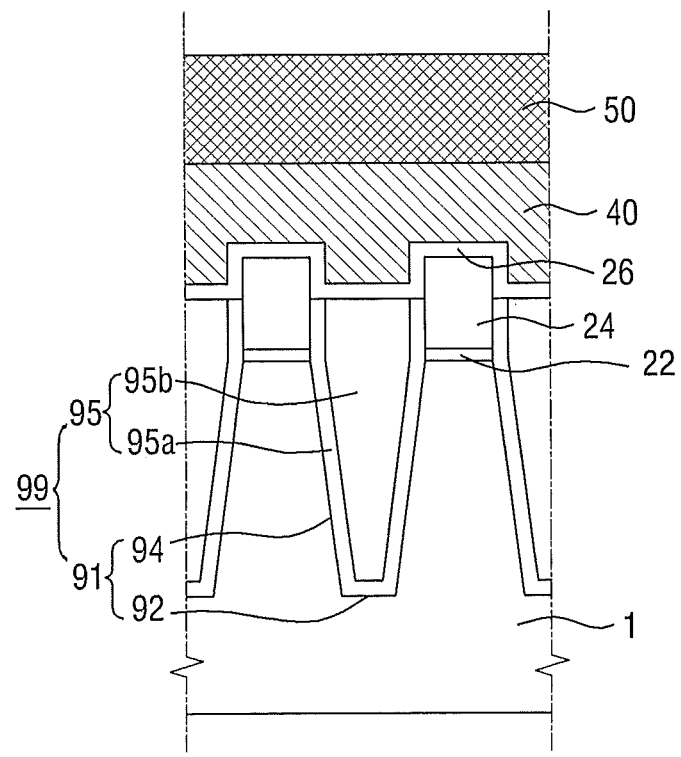
FIG. 9 is a cross-sectional view taken along the line X-X of FIG. 7.

Hereinafter, a nonvolatile memory device (e.g., a NAND flash memory device) according to further embodiments of the inventive subject matter will be described with reference to FIGS. 5 to 9. FIG. 5 is a block diagram of a nonvolatile memory device according to further embodiments of the inventive subject matter, FIG. 6 is a circuit diagram of a cell array area shown in FIG. 5, FIG. 7 is a layout view of the cell array area shown in FIG. 5, FIG. 8 is a cross-sectional view taken along the line Y-Y of FIG. 7, and FIG. 9 is a cross-sectional view taken along the line X-X of FIG. 7.

Figure 6:
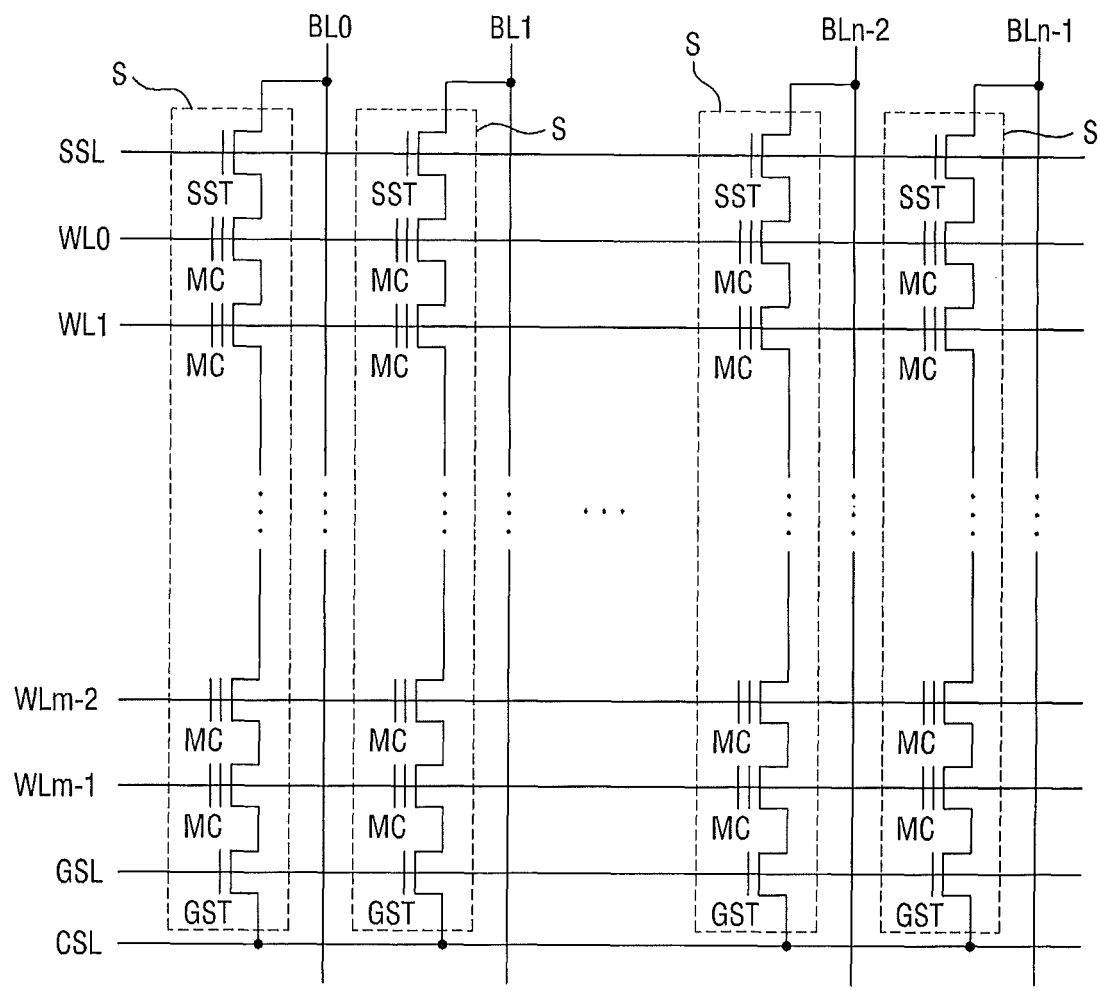
FIG. 6 is a circuit diagram of a cell array area shown in FIG. 5.
Figure 7:
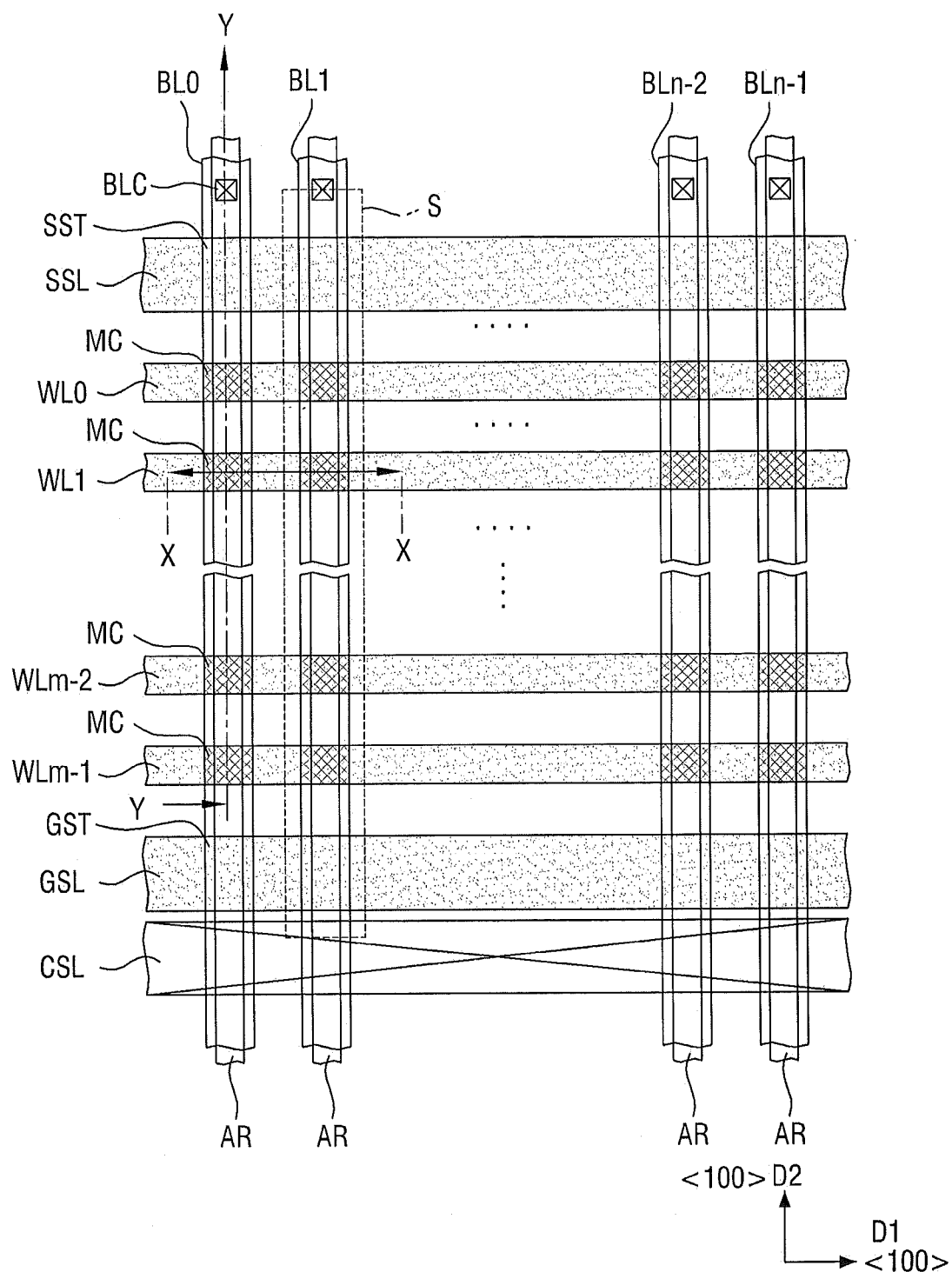
FIG. 7 is a layout view of the cell array area shown in FIG. 5.

Referring to FIGS. 5 to 7, a plurality of cell blocks BLK0 to BLK1−1 are arranged in a cell array area A of the nonvolatile memory device. A plurality of active regions AR are arranged for each of the plurality of cell blocks BLK0 to BLK1−1, and a string select line SSL, a ground select line GSL and a common source line CSL are disposed perpendicular to the active regions AR. A plurality of word lines WL0 to WLm−1 are disposed between the string select line SSL and the ground select line GSL. The plurality of bit lines BL0 to BLn−1 cross the plurality of word lines WL0 to WLm−1. A plurality of memory cell transistors MC are defined at intersections of the plurality of bit lines BL0 to BLn−1 and the plurality of word lines WL0 to WLm−1. A string select transistor SST and a ground select transistor GST are defined at each of intersections of the bit lines BL0 to BLn−1 and each of the string select line SSL and the ground select line GSL. The string select transistor SST, the plurality of memory cell transistors MC and the ground select transistor GST are connected in series to, thereby forming a string S. In each bit line BL, the strings S formed for the respective cell blocks BLK0~BLK1−1 are connected in parallel, e.g., a drain of the string select transistor SST of each string S is connected to the bit line BL. A source of the ground select transistor GST is connected to the common source line CSL.

As shown in FIG. 7, the active regions AR and the plurality of word lines WL0 to WLm−1 may extend along different <100> directions, e.g., the plurality of word lines WL0 to WLm−1 may extend along a first direction D1 (that is, in a <100> direction of FIG. 1) and the active regions AR may extend along a second direction D2 (i.e., in another <100> direction of FIG. 1). In addition, the plurality of bit lines BL0 to BLn−1 may also extend along the second direction D2 (that is, in another <100> direction of FIG. 1).

Page buffers P/B are disposed at first and second (upper and lower in FIG. 5) sides of a peripheral circuit area B, and row decoders R/D are disposed at third and fourth (left and right in FIG. 5) sides of the peripheral circuit area B.

Referring to FIGS. 8 and 9, a plurality of first and second stacked gate structures 10 and 12 may be formed on the substrate 1. The first stacked gate structures 10 may correspond to gates of memory cell transistors MC, and the second stacked gate structures 12 may correspond to gates of string select transistors SST or ground select transistors GST.

The first and second stacked gate structures 10 and 12 may be constructed such that include stacked lower structures 30 and 32, conductive patterns 40 and damascene metal film patterns 50. A dual layered structure having the conductive pattern 40 and the damascene metal film pattern 50 formed in the cell array area A may correspond to the word lines (WL0 to WLm−1 of FIG. 7) extending in one direction.

The lower structure 30 of the first stacked gate structure 10 include a stack of a tunneling insulation layer 22, a charge storage layer 24 and a blocking insulation layer 26. The charge storage layer 24 and the conductive pattern 40 are electrically insulated from one another by the blocking insulation layer 26.

The tunneling insulation layer 22 of the first stacked gate structure 10 may be a single layer or a composite layer formed using, for example, one or more of materials suitable for electron tunneling, selected from the consisting of $SiO_2$, $Hf_xO_y$, $Al_xO_y$, $Zr_xO_y$, $Ta_xO_y$, $Hf_xSi_{1-x}O_y$, and $Hf_xSi_{1-x}O_yN_z$, but not limited thereto. The tunneling insulation layer 22 may have a thickness in a range of approximately 30 to approximately 100□.

The charge storage layer 24 of the first stacked gate structure 10 is a region where electrons that pass through the tunneling insulation layer 22 are stored. When the nonvolatile semiconductor integrated circuit is designed to be a floating gate device, the charge storage layer 24 may be made of polysilicon doped with an impurity. If the nonvolatile semiconductor integrated circuit is designed to be a floating trap device, such as a MONOS (Metal Oxide Nitride Oxide Semiconductor) or a SONOS (Silicon Oxide Nitride Oxide Semiconductor), the charge storage layer 24 may be made of a material capable of trapping electrons, for example, SiN. The floating trap type nonvolatile semiconductor integrated circuit has a non-conductive property and may be formed to be lower than shown in the drawing.

The blocking insulation layer 26 of the first stacked gate structure 10 is an inter-gate insulation layer, and blocks charges stored in the charge storage layer 24 from moving to the conductive pattern 40 and the damascene metal film pattern 50. The blocking insulation layer 26 may be a single layer or a composite layer formed using, for example, one or more of materials selected from the consisting of ONO, $SiO_2$, $Hf_xO_y$, $Al_xO_y$, $Zr_xO_y$, $Ta_xO_y$, $Hf_xSi_{1-x}O_y$, and $Hf_xSi_{1-x}O_yN_z$, but not limited thereto. The blocking insulation layer 26 may have a thickness in a range of approximately 50 Å to approximately 150□.

The conductive pattern 40 may be, for example, a polysilicon layer doped with an impurity.

The damascene metal film pattern 50 is a metal film pattern formed by a damascene process, and may be a film made of W, Al, Cu, or Pt and a combination film of these materials.

The lower structure 32 of the second stacked gate structure 12 may be electrically connected to the charge storage layer 24 or the conductive pattern 40 by partially or entirely removing the blocking insulation layer 27 (see FIG. 8). The tunneling insulation layer 22, the charge storage layer 24 and the blocking insulation layer 27 in the lower structure 32 of the second stacked gate structure 12 may be the same as materials and thicknesses of those of the first stacked gate structure 10 in view of material and thickness. Materials forming the conductive pattern 40 and the damascene metal film pattern 50 of the second stacked gate structure 12 may also be the same as those of the first stacked gate structure 10.

Spacers 60 may be formed on sidewalls of the first and second stacked gate structures 10 and 12. As shown, the spacer 60 between the first stacked gate structures 10 and the spacer 60 between the first stacked gate structure 10 and the second stacked gate structure 12 make contact with each other, and spacers between the second stacked gate structures 12 may not make contact with each other.

A stop layer 70 is conforms to a top surface of the first stacked gate structure 10, a top surface and sidewalls of the second stacked gate structure 12 and a top surface of the substrate 1 exposed by the first and second stacked gate structures 10 and 12. Since the spacer 60 is formed in spaces between the first stacked gate structures 10 and between the first stacked gate structure 10 and the second stacked gate structure 12, the stop layer 70 may not be formed in the intervening areas. The stop layer 70 may be made of SiN, or SiON and may have a thickness of, for example, 500□ or less, specifically in a range of approximately 200 to approximately 300□.

In addition, the stop layer 70 formed on the top surface of the first stacked gate structure 10 and the top surface and sidewalls of the second stacked gate structure 12 serves as a passivation layer. A high voltage is applied to the first and second stacked gate structures 10 and 12 of a NAND type nonvolatile memory integrated circuit during operation, and mobile ions around the first and second stacked gate structures 10 and 12 may be drawn toward the first and second stacked gate structures 10 and 12, resulting in leakage current generated around the first and second stacked gate structures 10 and 12. The stop layer 70 inhibits drawing of the mobile ions toward the first and second stacked gate structures 10 and 12, thereby reducing the likelihood that electrical properties of the NAND type nonvolatile memory integrated circuit will be degraded.

An interlevel insulation layer 80 may be formed on the stop layer 70, and bit lines BL0 to BLn−1, may be formed on the interlevel insulation layer 80. As shown in FIGS. 7 and 8, a bit line contact BLC may pass through the interlevel insulation layer 80 to contact a region 5a of the substrate 1 beside the stacked gate structure 12.

As shown in FIG. 8, separate junction areas may not be formed in active regions between the word lines (WL0 to WLm−1 of FIG. 7). As distances between the word lines WL0 to WLm−1 are reduced, it may be difficult to control the concentration and location of the junction area between the word lines WL0 to WLm−1. Therefore, operation of the nonvolatile memory device may use minority carrier (e.g., intrinsic electron) in the substrate 1 without forming a separate junction area.

Referring to FIG. 9, as described above, the trench 91 of the isolation region 99 may have the bottom surface 92 and the sidewall 94. For example, the field insulation film 95 may include a first insulation layer 95a formed along the bottom surface 92 and sidewall 94 of the trench 91, and a second insulation layer 95b formed on the first insulation layer 95a and filling the trench 91.

The first plane index PI1 of the bottom surface 92 and the second plane index PI2 of the sidewall 94 may be different from each other. The second interface trap density of the second plane index PI2 of the sidewall 94 may be equal to or less than the first interface trap density of the first plane index PI1 of the bottom surface 92. For example, the first plane index PI1 may be (100), and the second plane index PI2 may be (100) or (310). The sidewall 94 having the second plane index PI2, that is, (100) or (310), may have a relatively low interface trap density.

During a read/write operation of the NAND nonvolatile memory device, the current of a cell should pass through the plurality of transistors SST, MC, GST, etc. constituting a string. Therefore, if the amount of the cell current is small, characteristics of the read/write operation may deteriorate. However, if a separator junction area is not formed, the amount of minority carriers (e.g., intrinsic electrons) is small. If there are many interface traps in the sidewall 94, the minority carriers combine with the interface traps of the sidewall 94, and the cell current may be considerably reduced. Therefore, the amount of cell current is reduced, thereby deteriorating the characteristics of the read/write operation.

However, in a nonvolatile memory device according to some embodiments of the inventive subject matter, the second interface trap density of the second plane index PI2 of the sidewall 94 is equal to or less than the first interface trap density of the first plane index PI1 of the bottom surface 92. Therefore, since the frequency of the minority carriers combining with the interface traps of the sidewall 94 is reduced, a sufficient amount of the cell current can be obtained, thereby improving the characteristics of the read/write operation.

Figure 10:
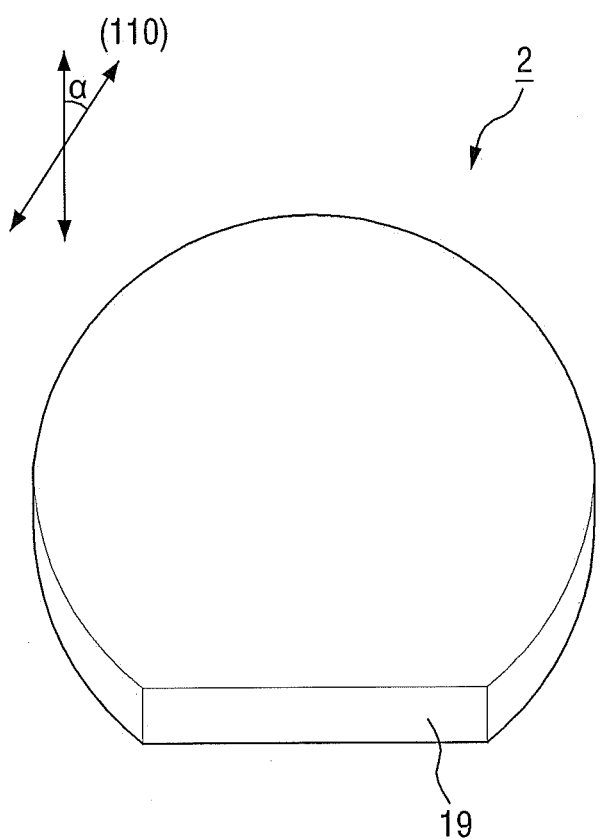
FIG. 10 illustrates another exemplary substrate used in a nonvolatile memory device according to some embodiments of the inventive subject matter.

FIG. 10 illustrates another exemplary substrate used in a nonvolatile memory device according to some embodiments of the inventive subject matter.

Referring to FIG. 10, a substrate 2 may have the alignment basis region 19 having a plane index (110) corresponding to rotation of $\alpha°$ from a (110) plane, where $0<\alpha\leq45$ or $-45\leq\alpha<0$. As described above, using the substrate 1 rotated by $\alpha°$ from the (110) plane, where $0<\alpha\leq45$ or $-45\leq\alpha<0$, the trench (91 of FIG. 2) may be configured to have a first plane index PI1 of its bottom surface (92 of FIG. 2) and a second plane index PI2 of its sidewall (94 of FIG. 2), which are different from one another. The first plane index PI1 may have a first interface trap density, and the second plane index PI2 may have a second interface trap density equal to or less than the first interface trap density. For example, when $\alpha$ is 18.5 or −18.5, the first plane index PI1 may be (100) and the second plane index PI2 may be (310). When $\alpha$ is 45 or −45, the first plane index PI1 may be (100) and the second plane index PI2 may be (100).

While the inventive subject matter has been particularly shown and described with reference to exemplary embodiments thereof, it will be understood by those of ordinary skill in the art that various changes in form and details may be made therein without departing from the spirit and scope of the inventive subject matter as defined by the following claims. It is therefore desired that the present embodiments be considered in all respects as illustrative and not restrictive, reference being made to the appended claims rather than the foregoing description to indicate the scope of the invention.

What is claimed is:

1. A nonvolatile memory device comprising:
   a substrate;
   an elongated isolation region comprising a field insulation film disposed in a trench in the substrate; and
   a word line crossing the elongated isolation region and comprising a tunneling insulation layer on an active region of the substrate adjacent the elongated isolation region, a charge storage layer on the tunneling insulation layer and a blocking insulation layer on the charge storage layer,
   wherein a first plane index of a bottom surface of the trench has a first interface trap density, wherein a second plane index of a sidewall of the trench has a second interface trap density equal to or less than the first interface trap density, and wherein the first plane index is (100) and the second plane index is (310).

2. The nonvolatile memory device of claim 1, wherein the substrate has an alignment basis region having a plane index corresponding to a rotation of $\alpha°$ from a plane having a plane index (110), where $0<\alpha\leq45$ or $-45\leq\alpha<0$.

3. The nonvolatile memory device of claim 2, wherein $\alpha$ is 18.5 or −18.5.

4. The nonvolatile memory device of claim 1, wherein a plane index of an alignment basis region of the substrate is (100).

5. The nonvolatile memory device of claim 1, wherein the word line extends in a <100> direction.

6. The nonvolatile memory device of claim 1, wherein a separate junction area is not formed in the active region.

7. The nonvolatile memory device of claim 1, wherein the substrate is a silicon on insulator (SOI) substrate.

8. The nonvolatile memory device of claim 1, wherein the substrate comprises a base substrate and an epitaxial layer disposed on the base substrate.

9. A nonvolatile memory device comprising:
   a substrate having an alignment basis region having a plane index corresponding to a rotation of $\alpha°$ from a plane having a plane index (110), where $0<\alpha\leq45$ or $-45\leq\alpha<0$;
   an elongated isolation region comprising a field insulation film disposed in a trench in the substrate; and
   a word line crossing the elongated isolation region and comprising a tunneling insulation layer on an active region of the substrate adjacent the elongated isolation region, a charge storage layer on the tunneling insulation layer and a blocking insulation layer on the charge storage layer,
   wherein a bottom surface of the trench has a first plane index of (100), and wherein a sidewall of the trench has a second plane index of (310).

10. The nonvolatile memory device of claim 9, wherein $\alpha$ is 18.5 or −18.5.

11. The nonvolatile memory device of claim 9, wherein a separate junction area is not formed in the active region.

12. A nonvolatile memory device comprising:
   a substrate having an alignment basis region with a plane index of (100);
   an elongated isolation region in the substrate and defining an elongated active region; and
   a word line crossing the elongated active region and comprising a tunneling insulation layer on the elongated active region, a charge storage layer on the tunneling insulation layer and a blocking insulation layer on the charge storage layer,
   wherein the elongated active region and the word line linearly extend along respective different <100> directions and
   wherein the elongated isolation region comprises a field insulation film in a trench, wherein a first plane index of a bottom surface of the trench has a first interface trap density, wherein a second plane index of a sidewall of the trench has a second interface trap density, equal to or less than the first interface trap density and wherein the first plane index is (100) and the second plane index is (310).

* * * * *